(12) United States Patent
Yuan et al.

(10) Patent No.: US 12,021,061 B2
(45) Date of Patent: Jun. 25, 2024

(54) PACKAGED MEMORY DEVICE WITH FLIP CHIP AND WIRE BOND DIES

(71) Applicant: Western Digital Technologies, Inc., San Jose, CA (US)

(72) Inventors: Rui Yuan, Shanghai (CN); Hope Chiu, Shanghai (CN); Paul Qu, Shanghai (CN); Kevin Du, Shanghai (CN); Zengyu Zhou, Shanghai (CN); Yi Su, Shanghai (CN); Shixing Zhu, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 264 days.

(21) Appl. No.: 17/191,849

(22) Filed: Mar. 4, 2021

(65) Prior Publication Data
US 2022/0285316 A1 Sep. 8, 2022

(51) Int. Cl.
| | |
|---|---|
| *H01L 25/065* | (2023.01) |
| *G11C 5/06* | (2006.01) |
| *H01L 21/50* | (2006.01) |
| *H01L 23/00* | (2006.01) |
| *H01L 23/495* | (2006.01) |
| *H10B 20/00* | (2023.01) |
| *H10B 41/27* | (2023.01) |
| *H10B 43/27* | (2023.01) |
| *H01L 21/60* | (2006.01) |

(52) U.S. Cl.
CPC ............ *H01L 25/0652* (2013.01); *G11C 5/06* (2013.01); *H01L 21/50* (2013.01); *H01L 23/4951* (2013.01); *H01L 24/14* (2013.01); *H01L 24/95* (2013.01); *H10B 20/50* (2023.02); *H10B 41/27* (2023.02); *H10B 43/27* (2023.02); *H01L 2021/60007* (2013.01)

(58) Field of Classification Search
None
See application file for complete search history.

(56) References Cited

U.S. PATENT DOCUMENTS

| | | | |
|---|---|---|---|
| 7,282,792 | B2 | 10/2007 | Wark |
| 7,867,819 | B2 | 1/2011 | Upadhyayula et al. |
| 8,258,015 | B2 | 9/2012 | Chow et al. |
| 8,373,268 | B2 | 2/2013 | Upadhyayula et al. |

(Continued)

OTHER PUBLICATIONS

Wikipedia, "Flip Chip," <https://en.wikipedia.org/wiki/Flip_chip> web page accessed May 21, 2021.

*Primary Examiner* — Sarah K Salerno
(74) *Attorney, Agent, or Firm* — Michael Best & Friedrich LLP

(57) ABSTRACT

A memory device includes a substrate, a controller die, a flip chip die, first and second silicon dies, and bond wires. The controller and flip chip dies are attached to the substrate using connection balls and in electrical communication with each other. The first and second silicon dies include respective first and second contact pad surfaces. The bond wires electrically connect the contact pad surfaces to the substrate so the first and second silicon dies communicate with the controller die. The flip chip die and first and second silicon dies are NAND dies, the flip chip die is configured as SLC memory, and the silicon dies are configured as one of MLC memory, TLC memory, or QLC memory.

14 Claims, 12 Drawing Sheets

(56) References Cited

U.S. PATENT DOCUMENTS

| | | | |
|---|---|---|---|
| 9,285,997 B2 | 3/2016 | Tanzawa | |
| 9,530,491 B1* | 12/2016 | Uttarwar | G11C 16/10 |
| 2009/0113112 A1* | 4/2009 | Ye | G06F 12/0246 |
| | | | 711/E12.007 |
| 2009/0166887 A1* | 7/2009 | Upadhyayula | H01L 24/06 |
| | | | 257/E23.024 |
| 2011/0264843 A1* | 10/2011 | Haines | G06F 3/0679 |
| | | | 711/170 |
| 2014/0006733 A1* | 1/2014 | Seo | G06F 3/0604 |
| | | | 711/156 |
| 2016/0291869 A1* | 10/2016 | Yi | G06F 3/061 |
| 2017/0220293 A1* | 8/2017 | Kim | G11C 5/02 |
| 2017/0278833 A1* | 9/2017 | Park | G11C 5/066 |
| 2020/0144224 A1* | 5/2020 | Lin | H01L 24/13 |
| 2020/0183825 A1 | 6/2020 | Ellis et al. | |
| 2020/0211913 A1* | 7/2020 | De La Cerda | G11C 5/04 |
| 2020/0222734 A1* | 7/2020 | Wechsler | A62C 3/00 |
| 2020/0273783 A1 | 8/2020 | Sankman et al. | |
| 2021/0303203 A1* | 9/2021 | Eliash | G06F 3/0679 |
| 2022/0254390 A1* | 8/2022 | Gans | G11C 5/04 |

\* cited by examiner

PACKAGED MEMORY DEVICE WITH FLIP CHIP AND WIRE BOND DIES

BACKGROUND

The present disclosure relates to storage devices. More particularly, the present disclosure relates to a packaged memory device including a flip chip die and wire bond dies.

The capacity and speed of memory arrangements in data storage devices, such as solid state drives (SSDs), is continually improving as technology advances. Demand for higher processing speeds requires increased throughput of memory arrangements. As such, manufacturers of storage devices seek to increase both storage capacity and data throughput for their devices. While it is desirable to increase storage capacity of memory arrangements, the size of the packaged memory device may not be easily increased. Further, such improvements are nearly always sought to be implemented at a relatively low cost.

SUMMARY

A packaged memory device and methods of assembling the memory device of the disclosure include electrically connecting individual silicon die at a contact pad surface to a controller die. The silicon dies are vertically stacked and placed on top of or adjacent to a flip chip die. For example, the addition of the flip chip die to ceiling NAND die packaging combines the advantages of flip chip technology and wire bonding technology.

In particular, when the flip chip die is applied to the ceiling NAND die packaging, the addition of the flip chip die improves both electrical and thermal performance of the memory device because the flip chip die may be used to store data at high frequency and/or at demanding high read/write speeds relative to the other silicon dies. Specifically, the flip chip die may include single level cell (hereinafter "SLC") NAND-based flash memory that stores data at high frequency and/or at demanding high read/write speeds relative to the other silicon dies that may be multi-level cell (hereinafter "MLC") NAND-based flash memory, triple level cell (hereinafter "TLC") NAND-based flash memory, or quad level cell (hereinafter "QLC") NAND-based flash memory.

Additionally, the NAND dies can be stacked vertically and staggered to allow for connections to be made by way of top or bottom located connection pads. This vertical and staggered arrangement reduces the lateral footprint of the NAND dies while maintaining the ease of access to the connection pads during wire bonding relative to connection pads located adjacent a vertical edge of the NAND dies, thereby allowing for a smaller overall form factor and easier manufacturing.

The disclosure provides a memory device including a substrate, a controller die, a flip chip die, a first silicon die, a second silicon die, and one or more bond wires. The controller die is attached to the substrate. The flip chip die is also attached to the substrate adjacent the controller die. The flip chip die is in electrical communication with the controller by way of the substrate. The first silicon die has a bottom surface attached to one of the substrate or a top surface of the flip chip die. The first silicon die includes a first contact pad surface opposite the bottom surface. The second silicon die is attached to the first contact pad surface of the first silicon die. The second silicon die includes a second contact pad surface. The one or more bond wires electrically connect the first and second contact pad surfaces to substrate, thereby electrically connecting them to the controller die by way of the substrate.

The disclosure also provides a method of assembling a memory device. The method includes attaching a controller die to a substrate, attaching a flip chip die to the substrate and adjacent to the controller die, attaching a bottom surface of a first silicon die to a top surface of the flip chip die, attaching a bottom surface of a second silicon die to a first contact pad surface of the first silicon die, electrically connecting the first and second contact pad surfaces to the substrate such that the first and second silicon dies are in communication with the controller die by way of the substrate. The flip chip die is in communication with the controller die by way of the substrate. The first contact pad surface is opposite the bottom surface of the first silicon die. The second contact pad surface is opposite the bottom surface of the second silicon die.

The disclosure also provides a memory device including a substrate, a controller die, a flip chip die, and a plurality of silicon dies. The controller die is attached and electrically connected to the substrate with a plurality of first solder balls. The flip chip die is attached and electrically connected to the substrate with a second plurality of solder balls. The flip chip die is adjacent to the controller die. The flip chip die is in communication with the controller die by way of the substrate. The plurality of silicon dies are stacked one atop another in an offset manner. A bottom one of the silicon dies is attached to one of a top surface of the flip chip die and the substrate. The plurality of silicon dies are electrically connected to the substrate with bond wires. The plurality of silicon dies are in communication with the controller die by way of the substrate. The flip chip die and the plurality of silicon dies comprise NAND dies.

In this manner, various aspects of the disclosure provide for improvements in at least the technical fields of memory devices and their design and architecture. The foregoing summary is intended solely to give a general idea of various aspects of the disclosure, and does not limit the scope of the disclosure in any way. Other aspects of the disclosure will become apparent by consideration of the detailed description, the claims, the Abstract, and the accompanying drawings.

DETAILED DESCRIPTION

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. It also will be understood by those of skill in the art that the drawings are not to scale, where some features are exaggerated in order to highlight such features.

Figure 1:
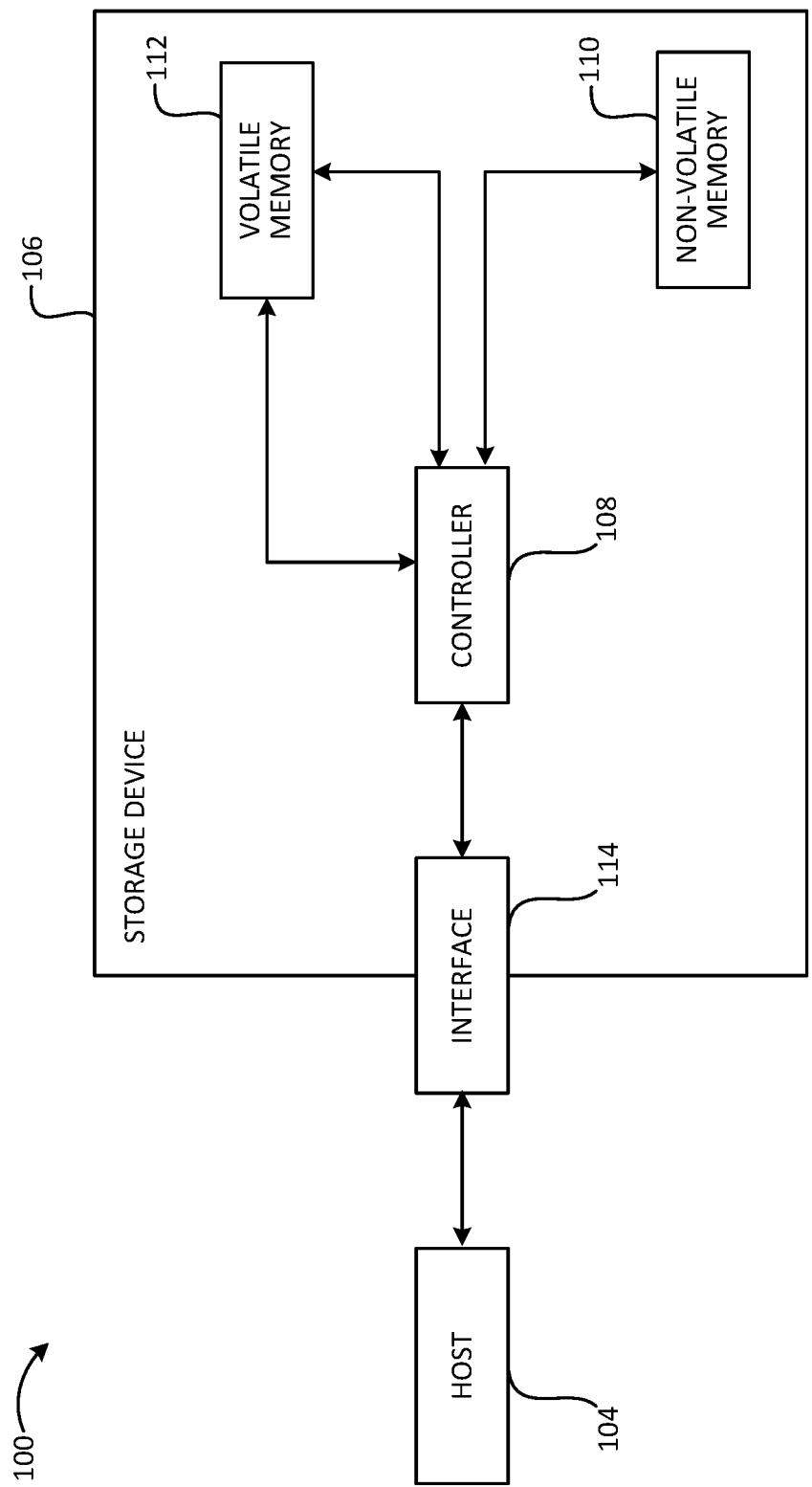
FIG. 1 is a block diagram illustrating a data storage system, according to embodiments described herein.

FIG. 1 is a block diagram illustrating a storage system 100 with a storage device 106 that may function in conjunction with a host device 104, in accordance with one or more techniques of this disclosure. For instance, the host device 104 may utilize non-volatile memory devices included in storage device 106 to store and retrieve data.

The storage system 100 includes the host device 104 that may store and/or retrieve data to and/or from the storage device 106. As illustrated in FIG. 1, the host device 104 may communicate with the storage device 106 by way of an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

As illustrated in FIG. 1, the storage device 106 includes a controller 108, non-volatile memory (NVM) 110, volatile memory 112, and an interface 114. In some examples, the storage device 106 may include additional components not shown in FIG. 1 for sake of clarity. For example, the storage device 106 may include a printed circuit board (PCB) to which components of the storage device 106 are mechanically attached and that includes electrically conductive traces that electrically interconnect components of the storage device 106, or the like. In some embodiments, the storage device 106 may include fewer components, for example, where one or more of the volatile memory 112 and the interface 114 are part of the controller 108. In some examples, the physical dimensions and connector configurations of the storage device 106 may conform to one or more standard form factors. Some example standard form factors of the storage device may include 3.5" data storage device, 2.5" data storage device, and 1.8" data storage device. Some example standard form factors of the interface 114 may include peripheral component interconnect (PCI), PCI-extended (PCI-X), and PCI Express (PCIe) (e.g., PCIe xl, x4, x8, x16, PCIe Mini Card, MiniPCl, etc.). In some examples, the storage device 106 may be directly attached (e.g., directly soldered) to a motherboard of the host device 104.

The interface 114 of the storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), or the like. The interface 114 is communicatively connected (e.g., a data bus, a control bus, or other suitable connection) to the controller 108, allowing data to be exchanged between the host device 104 and the controller 108. In some examples, the interface 114 may also permit the storage device 106 to receive power from the host device 104.

The NVM 110 may be part of a packaged integrated circuit (IC) or other packaged silicon device, such as a memory device. The NVM 110 may also include read/write circuitry that reads data from and writes data to another portion of the memory device. For instance, the read/write circuitry of the NVM 110 may receive data and a message from the controller 108 that instructs the read/write circuitry to store the data in the NVM 110. Similarly, the read/write circuitry of the NVM 110 may receive a message from the controller 108 that instructs the read/write circuitry to retrieve data from the NVM 110. In some examples, each die (i.e., the controller 108 and memory dies making up the NVM 110 of the memory device) may be individually referred to as a silicon die.

In some examples, the memory device may include any type of non-volatile memory. For example, the NVM 110 may include flash memory or any other suitable non-volatile memory. Flash memory may include NAND-based or NOR-based flash memory, and may store data based on a charge contained in a floating gate of a transistor for each flash memory cell. In NAND-based flash memory, the flash memory may be divided into a plurality of blocks that may divided into a plurality of pages. Each block of the plurality of blocks may include a plurality of NAND cells. Rows of NAND cells may be electrically connected using a word line to define a page of a plurality of pages. Respective cells in each of the plurality of pages may be electrically connected to respective bit lines. Furthermore, the NAND-based flash memory may be 2D or 3D, and may be configured as SLC, MLC, TLC, or QLC.

The volatile memory 112 may be used by the controller 108 to store information. The volatile memory 112 may be comprised of one or more volatile memory devices. In some examples, the controller 108 may use the volatile memory 112 as a cache. For instance, the controller 108 may store cached information in the volatile memory 112 until the cached information is written to the NVM 110. Examples of the volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The controller 108 manages one or more operations of the storage device 106. For instance, the controller 108 manages the reading of data from and/or the writing of data to the NVM 110. In some embodiments, when the storage device 106 receives a write command from the host device 104, the controller 108 may initiate a data storage command to store data to the NVM 110 and monitor the progress of the data storage command. In other embodiments, the controller 108 may determine at least one operational characteristic of the storage system 100 and store the at least one operational characteristic in the NVM 110.

Figure 2:
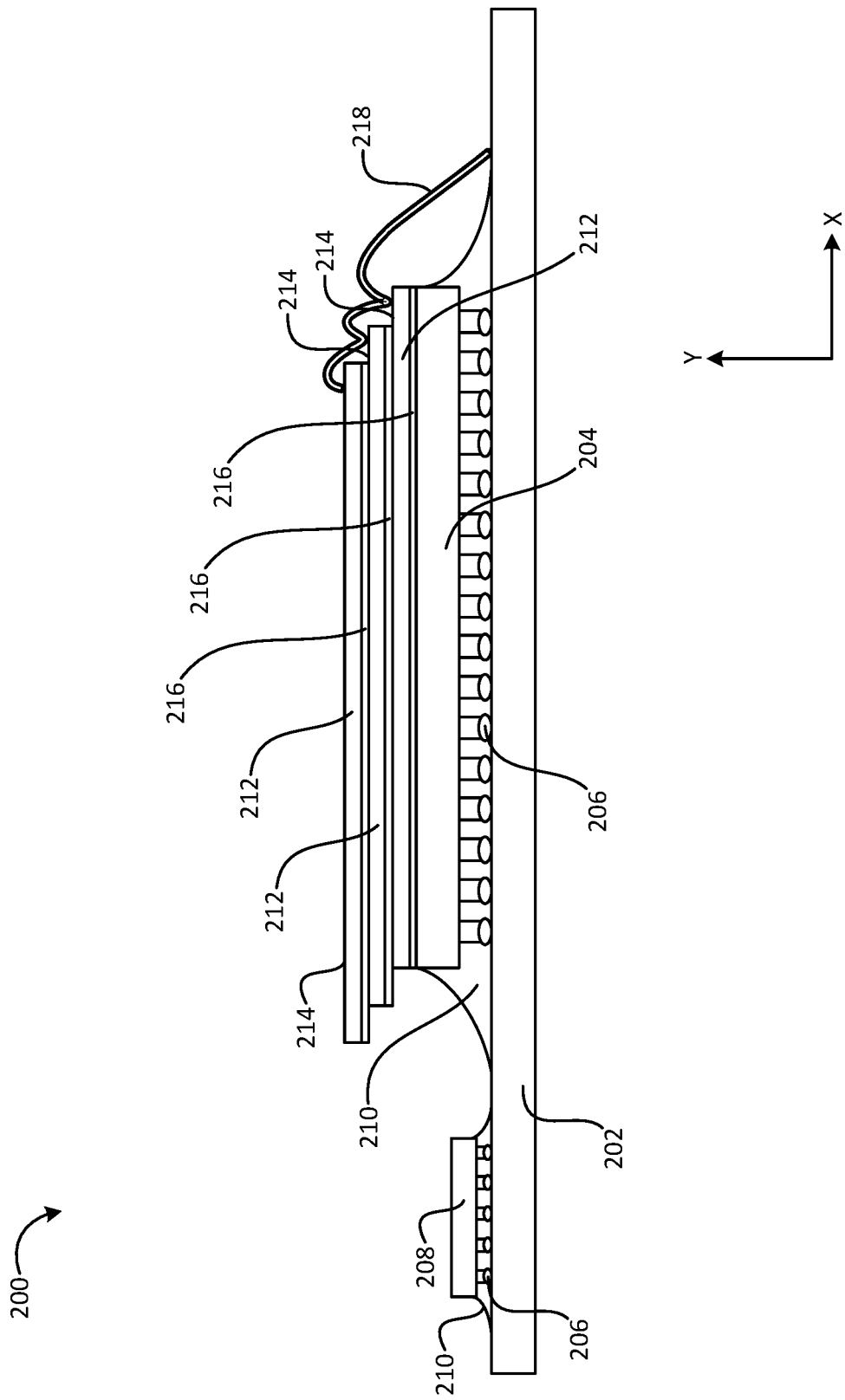
FIG. 2 is a diagram illustrating a memory device, according to embodiments described herein.

FIG. 2 is a diagram illustrating an example of a packaged IC 200 used in a data storage device (e.g., a memory device), according to one embodiment of the disclosure. The NVM 110 may be part of the packaged IC 200.

The packaged IC 200 includes a substrate 202. A flip chip die 204 is mounted on the substrate 202. The flip chip die 204 is attached to the substrate 202 with a plurality of solder bumps 206 disposed between the flip chip die 204 and the substrate 202 for electrically connecting the flip chip die 204 to the substrate 202 (e.g., electrically connecting the contacts of the flip chip die 204 to wires or traces on or embedded in the substrate 202). A controller die 208 also is attached to the substrate 202 with a plurality of the solder bumps 206 disposed between the controller die 208 and the substrate 202. The solder bumps 206 may be made entirely or partially of one or more metallic or other conductive materials such as, for instance, gold, silver, palladium, iridium, indium, silver/tin amalgams, one or more binary or ternary metal alloys, lead, and the like. As illustrated, an underfill 210 may be disposed between respective ones of the flip chip die 204 and the controller die 208 and the substrate 202. In some embodiments, this arrangement of the flip chip die 204 and the controller die 208 may be attached to the substrate 202 during the same or a parallel assembling phase and at approximately the same time.

Also shown in the illustrated embodiment of FIG. 2, a stack of silicon dies 212 are disposed on the flip chip die 204. More specifically, the flip chip die 204 is disposed between the stack of silicon dies 212 and the substrate 202. It should be noted herein that, while a stack of three silicon dies 212 is shown disposed on the flip chip die 204, other numbers of silicon dies 212 are contemplated herein including, for instance, two, four, five, six, seven, eight, nine, or other suitable number. In some example embodiments, the silicon dies 212 are NAND dies, because non-volatile memory 110 may be a combination of NAND dies and the flip chip die 204. That is, the flip chip die 204 also is a NAND die except that it is packaged for a flip chip connection instead of a wire bond connection.

Each silicon die 212 includes a contact pad surface 214 including a contact pad. Opposite from the contact pad surface 214, an adhesive (such as, for example, a die attach film) 216 is used to adhere an adjacent silicon die 212 to a non-active surface of the flip chip die 204. The adhesive 216 attaches the first silicon die 212 to the flip chip die 204. Similarly, each subsequent silicon die 212 is adhered to the previous silicon die 212 by a respective layer of adhesive 216. In some embodiments, the stack of silicon dies 212 may be adhered to each other prior to adhering the stack to the flip chip die 204. In other embodiments, the silicon dies 212 may be added one or more at a time after initially attaching the first silicon die 212 to the flip chip die 204.

The contact pad surface 214 of each silicon die 212 faces away from the flip chip die 204. This arrangement allows for electrical connectors (e.g., bond wires), such as one or more wires 218, to electrically couple the silicon dies 212 to the substrate 202 (e.g., to wires or traces on or embedded in the substrate 202) and, therefore, to other electrical components (such as the controller die 208, for instance). In some embodiments, the wires 218 may be made entirely or partially of one or more metallic or other conductive materials such as, for instance, copper, aluminum, gold, palladium, indium, iridium, various silver/tin amalgams, lead, as well as binary and/or ternary metal alloys, and the like. In some embodiments, the wires 218 is a round or substantially round wires, but other embodiments may include wires 218 that are flat or ribbon-type wires.

To facilitate the connection of the wires 218 to the contact pad on the contact pad surface 214 of each silicon die 212, the illustrated embodiment of the packaged IC 200 includes the silicon dies 212 stacked in an offset manner, resembling a flight of stairs. Other embodiments may include different arrangements of the silicon dies 212. Some embodiments may include silicon dies 212 offset due to having varying sizes and/or shapes. Further, some embodiments include silicon dies 212 that are a different size and/or shape compared to the flip chip die 204. Although not shown in FIG. 2, the flip chip die 204, controller die 208, stack of dies 212 and bond wires may be encapsulated with a molding compound, and solder balls attached to a bottom side of the substrate 202 to allow for external electrical communication.

Figure 3:
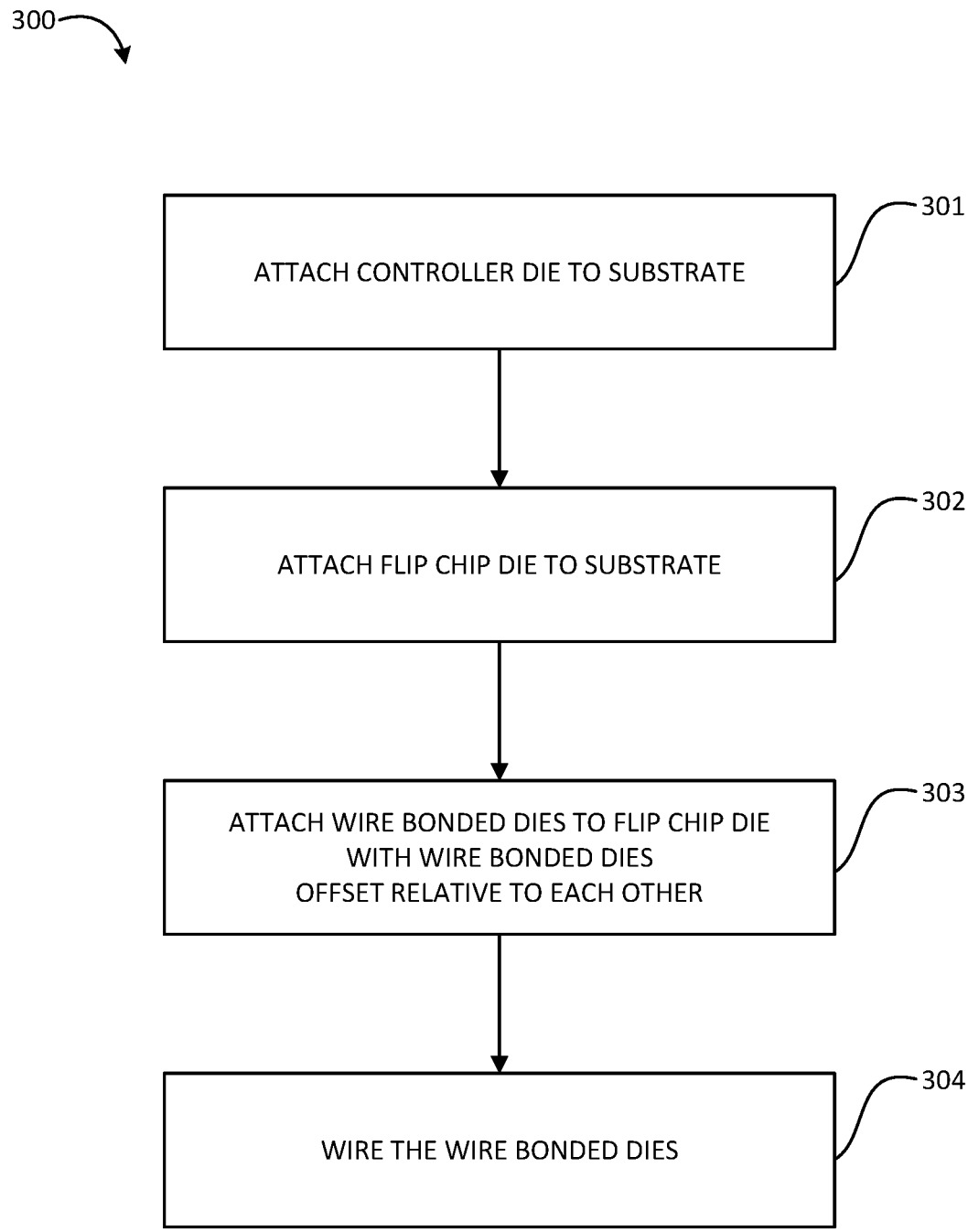
FIG. 3 is a flowchart illustrating a method of assembling the memory device of FIG. 2.
Figure 4:
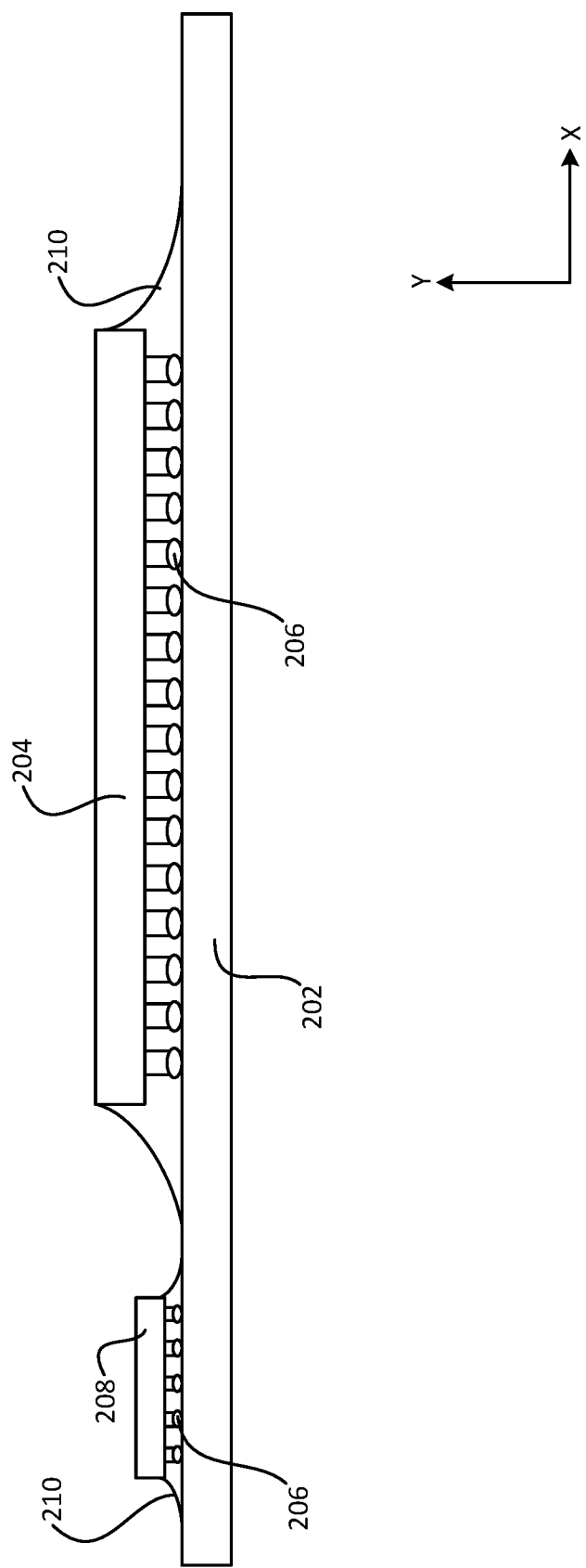
FIG. 4 is a diagram illustrating a first phase of the assembling process of FIG. 3.

Turning now to FIG. 3, a flowchart illustrating an example method of assembling 300 the packaged IC 200 is shown. The method 300 includes attaching the controller die 208 to the substrate 202 (at block 301) as shown in FIG. 4. The attaching of the controller die 208 to the substrate 202 may include, for instance, depositing solder bumps 208 on respective pads of the controller die 208, flipping the controller die 208, positioning the solder bumps 208 on connectors of the substrate 202, re-melting the solder bumps 208 (using, for instance, hot air reflow), and applying underfill 210 (using, for instance, capillary action with an electrically-insulating adhesive). The underfill 210 is then allowed to dry/cure.

The method 300 further includes attaching the flip chip die 204 to the substrate 202 (at block 302) as shown in FIG. 4. In some embodiments, the attaching of the flip chip die 204 to the substrate 202 may be performed simultaneously or at substantially the same time as attaching the controller die 208 to the substrate 202. The flip chip die 204 may be attached to the substrate 202 in substantially the same manner as described above with regard to the controller die 208, for instance.

Figure 5:
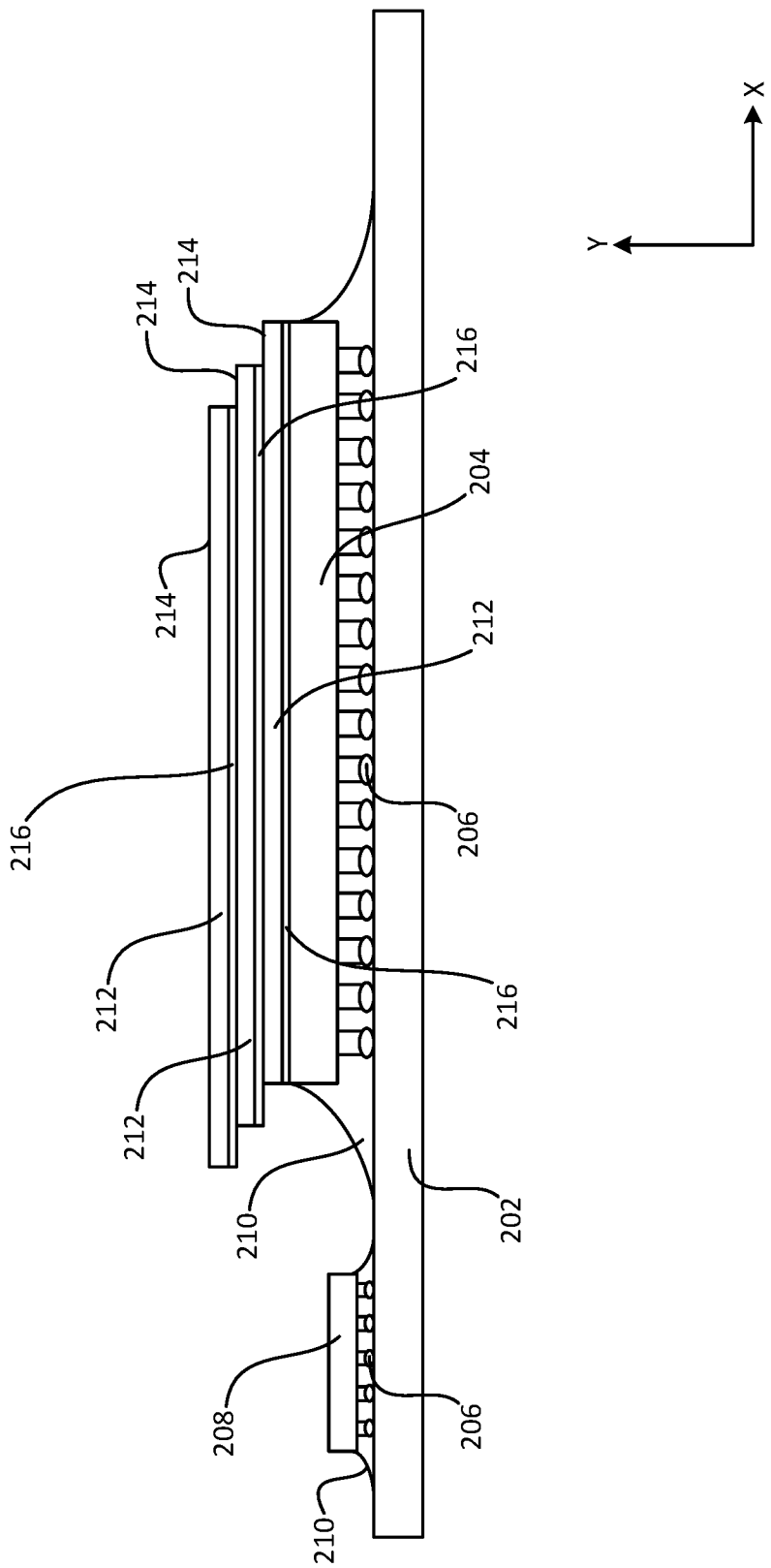
FIG. 5 is a diagram illustrating a second phase of the assembling process of FIG. 3.

The method 300 also includes stacking the silicon dies 212 to a top surface of the flip chip die 204 (at block 303) as shown in FIG. 5. In some embodiments, the attaching of the silicon dies 212 to the top surface of the flip chip die 204 may include, for instance, attaching the silicon dies 212 to each other prior to attaching the silicon dies 212 that are attached together to the top surface the flip chip die 204 with the adhesive 216 (e.g., a die attach film). In other embodiments, the attaching of the silicon dies 212 to the top surface of the flip chip die 204 may include attaching one silicon die 212 to the top surface of the flip chip die 204, attaching a second silicon die 212 to the top surface of the first silicon die 212, and so forth until all silicon dies 212 are attached together. The silicon dies 212 are arranged such that a portion of each top surface (also referred to as the "contact pad surface 214") of the corresponding silicon die 212 is exposed. This arrangement may be accomplished by staggering the silicon dies 212, utilizing silicon dies 212 of varying sizes/shapes, or the like.

Figure 6:
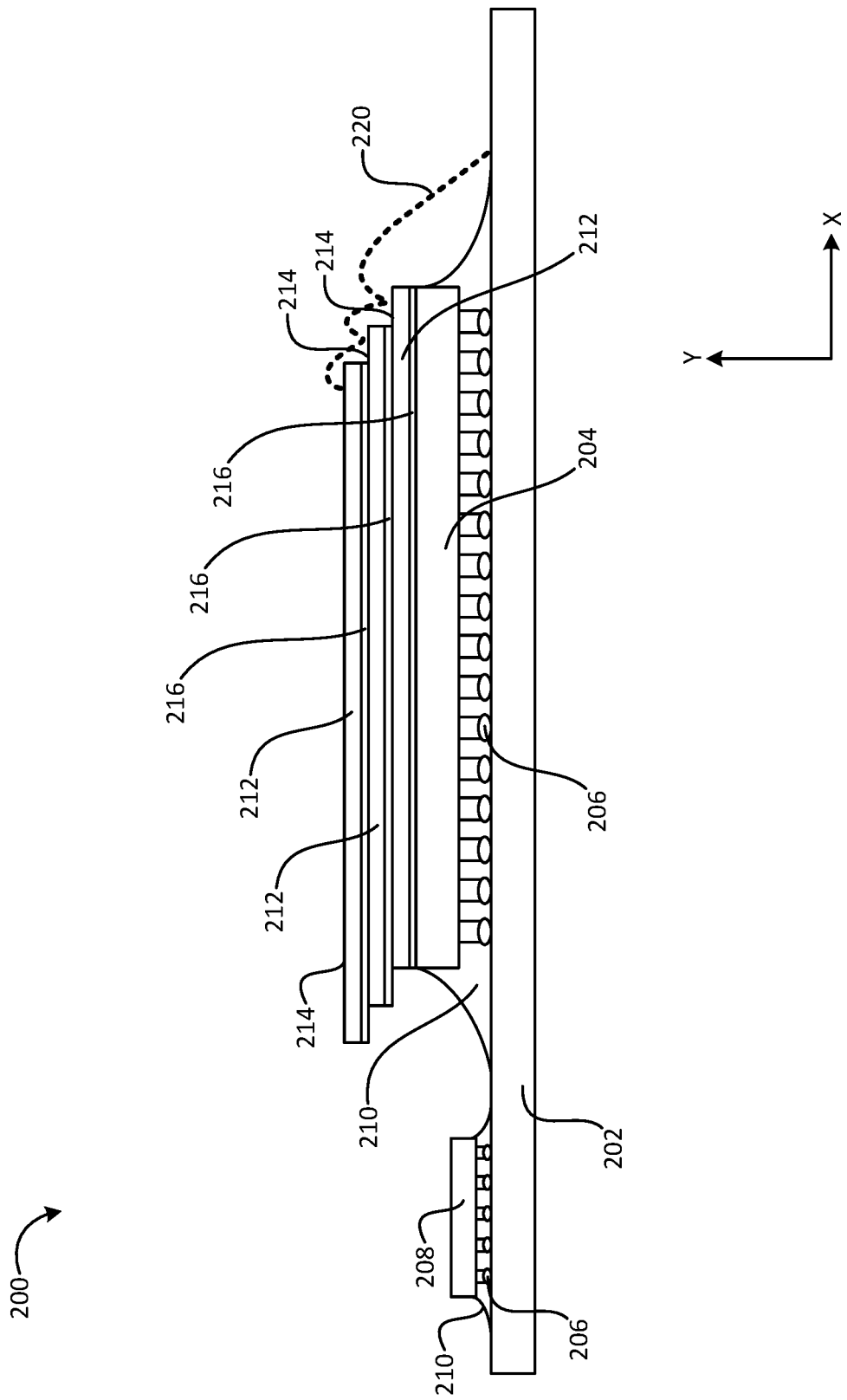
FIG. 6 is a diagram illustrating a wire bonding phase of the assembling process of FIG. 3.

The method 300 further includes electrically connecting the silicon dies 212 to each other and to the substrate 202 (e.g., wires or traces on or embedded in the substrate 202) (at block 304), and thereby enabling electrical communication between the silicon dies 212 and other components of the packaged IC 200 such as, for instance, the controller die 208 as shown in FIG. 2. As shown in FIG. 6, the wire(s) 218 of FIG. 2 may be coupled along one or more wire paths 220 with the wire(s) 218 contacting, for instance, the contact pad surface 214 of each of the silicon dies 212. Although only one wire 218 is shown in FIG. 2, it should be noted these illustrations include only one wire as a representation of one or more wires. Many embodiments will include several wires 218 electrically coupling the various electrical components, such as the silicon dies 212, to each other, to the controller die 208, and/or other suitable electrical components. The wires 218 may be connected between the silicon dies 218 and the substrate 202 using commercially available wire bonding machines, as is known in the art.

Figure 7:
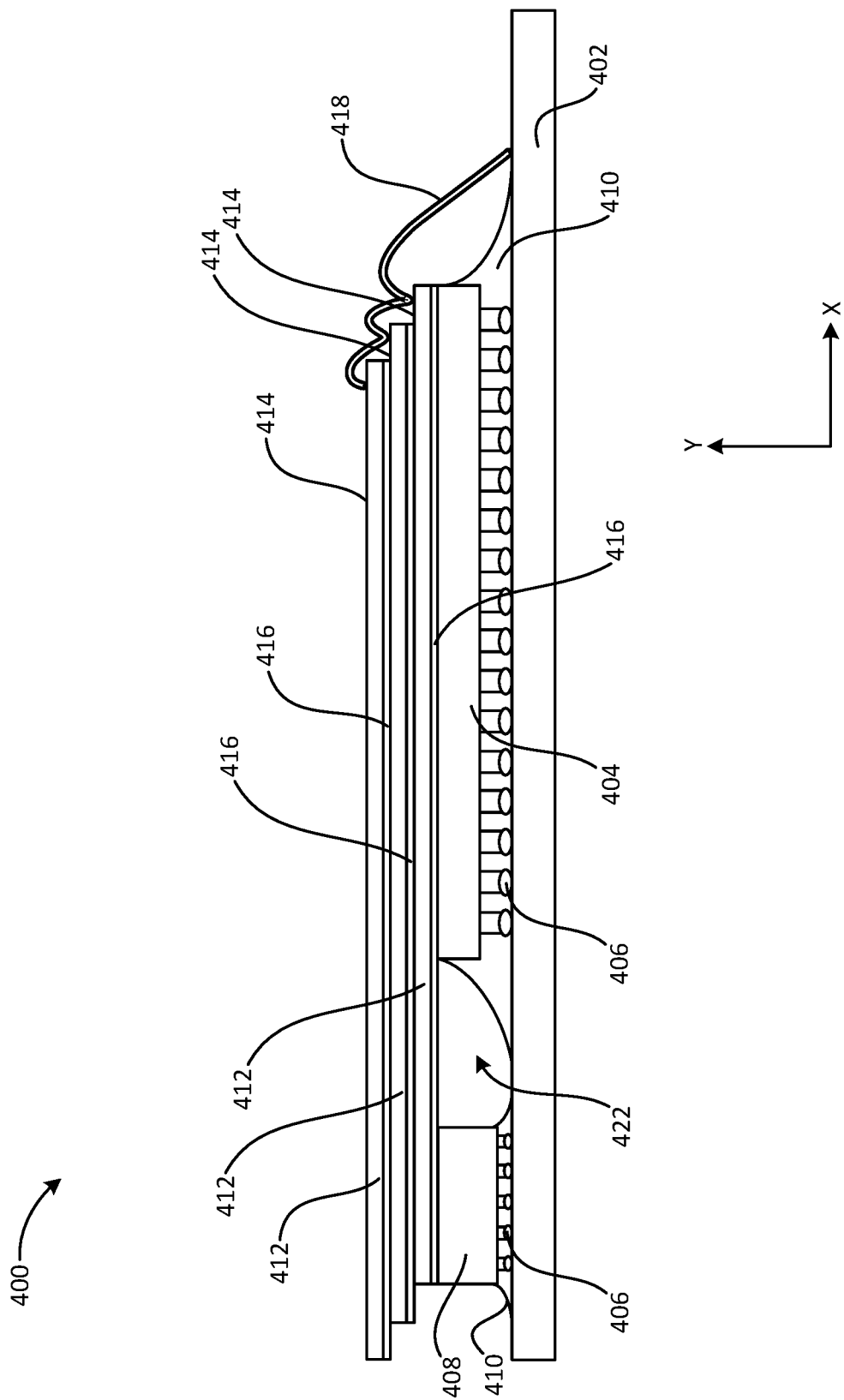
FIG. 7 is a diagram illustrating a memory device, according to embodiments described herein.

With reference to FIG. 7, a diagram illustrating another embodiment of a packaged IC 400 is shown. Many components of the packaged IC 400 are similar to those of the packaged IC 200 described above, and these similar components will be given a reference number that is a value of two hundred higher than the corresponding components described above with reference to the packaged IC 200. For the sake of brevity, only the differences between the packaged IC 200 and the packaged IC 400 will be discussed below.

As illustrated in FIG. 7, some embodiments of the packaged IC 400 may include a controller die 408 having a height that is the same as or substantially similar to the height of the flip chip die 404 such that top surfaces of the flip chip die 404 and the controller die 408 lie in the same plane. To accommodate any difference in thickness between the flip chip die 404 and the controller die 408, different height bumps/pillars 406 may be used to connect the dies 404 and 408 to the substrate 402. For instance, the height of the controller die 408 may be between 90% and 110% of the height of the flip chip die 404. In some embodiments, the height of the controller die 408 may be between 95% and 105% of the height of the flip chip die 404. This arrangement allows for larger silicon dies 412 than in other embodiments, because the silicon dies 412 may span at least partially over both the controller die 408 and the flip chip die 404. Some embodiments may include the controller die 408, the flip chip die 404, the silicon dies 412, and the substrate 402 defining a gap 422, that could optionally be occupied with some of the wires (such as wire 418) or with passive devices (not shown). Other embodiments could instead have additional underfill 410 or some other material substantially or completely occupying the space 422 to provide additional support to the silicon dies 412. This arrangement of having silicon dies 412 spanning at least partially over both the controller die 408 and the flip chip die 404 can allow for the packaged IC 400 with increased memory capacity without requiring a larger footprint. In such embodiments, the block 303 described above may further include attaching the silicon dies 412 to the top surface of the controller die 408. In some embodiments, the arrangement may further improve performance of the packaged IC 400.

Figure 8:
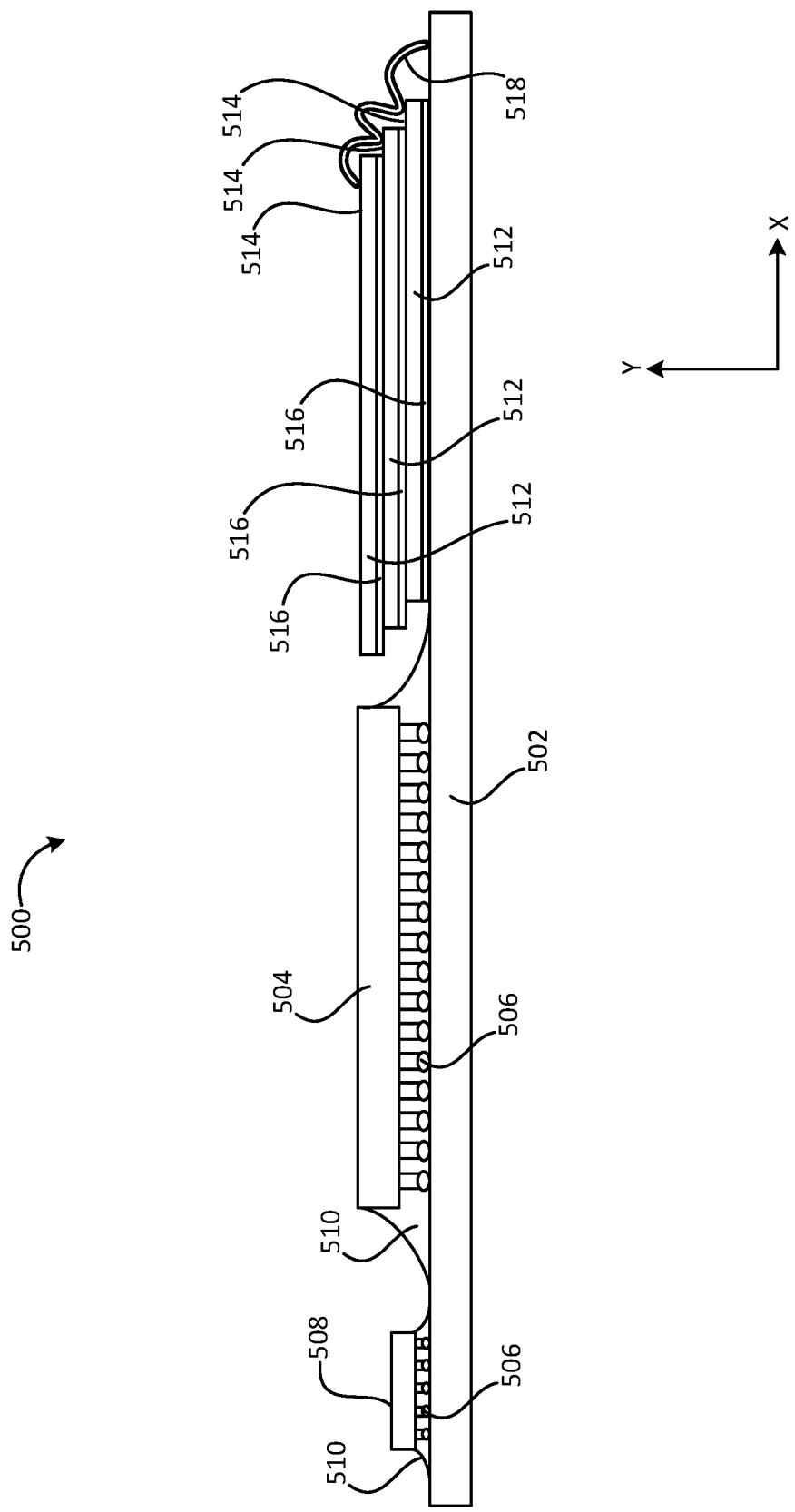
FIG. 8 is a diagram illustrating a memory device, according to embodiments described herein.

As shown in FIG. 8, a diagram illustrating yet another embodiment of a packaged IC 500 is shown. Many components of the packaged IC 500 are similar to those of the packaged IC 200 described above, and these similar components will be given a reference number that is a value of three hundred higher than the corresponding components described above with reference to the packaged IC 200. For the sake of brevity, only the differences between the packaged IC 200 and the packaged IC 500 will be discussed below.

As illustrated in FIG. 8, some embodiments of the packaged IC 500 may include the silicon dies 512 disposed on the substrate 502 instead of on the flip chip die 504. Although the illustrated embodiment includes the flip chip die 504 disposed nearer than the silicon dies 512 to the controller die 508, some embodiments may include the silicon dies 512 disposed nearer than the flip chip die 504 to the controller die 508.

Figure 9:
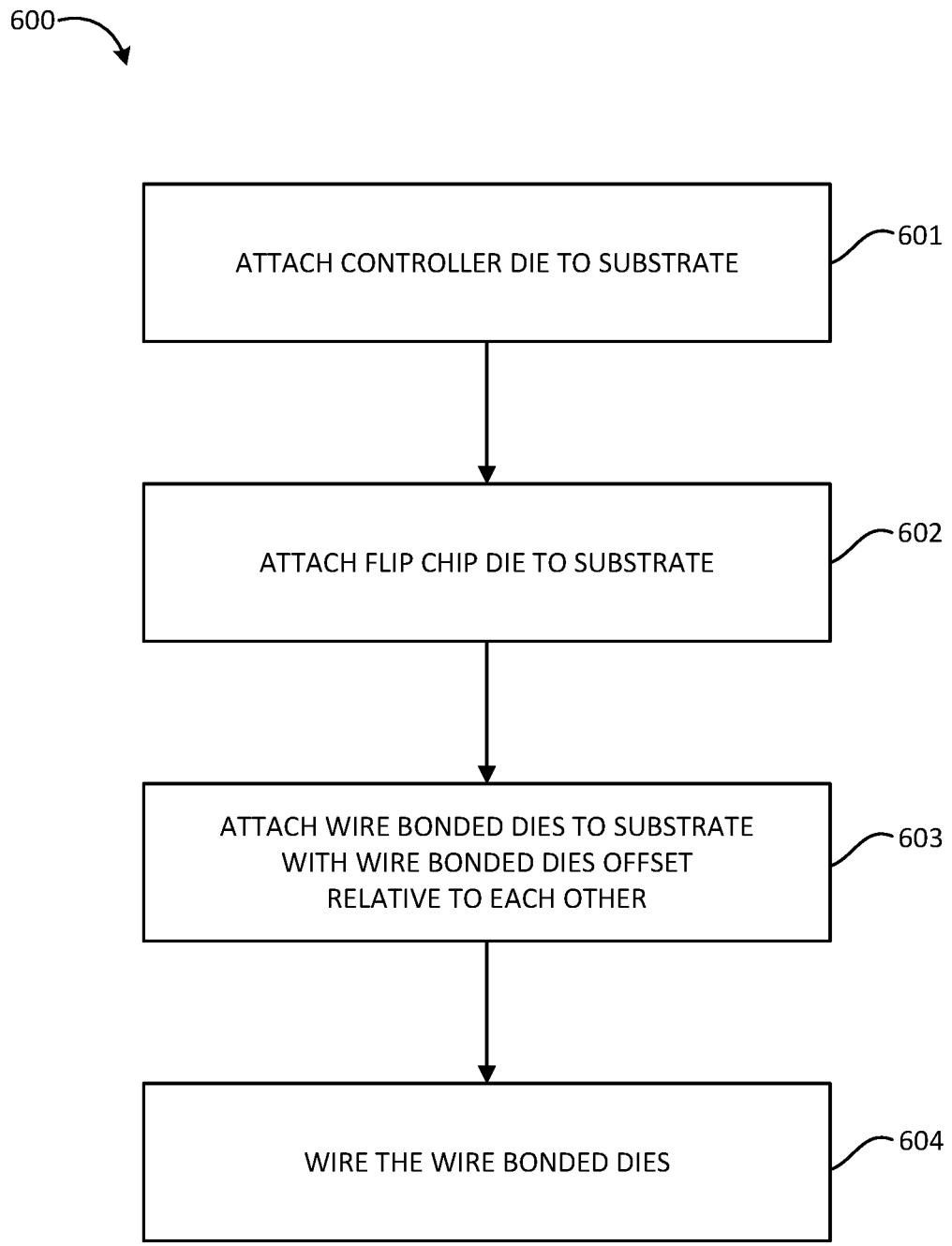
FIG. 9 is a flowchart illustrating a method of assembling the memory device of FIG. 8.

Turning now to FIG. 9, a flowchart illustrating an example method of assembling 600 the packaged IC 500 is shown. The method 600 includes attaching the controller die 508 to the substrate (at block 601) as shown in FIG. 10 in a manner, for instance, similar to block 301 described above.

Figure 10:
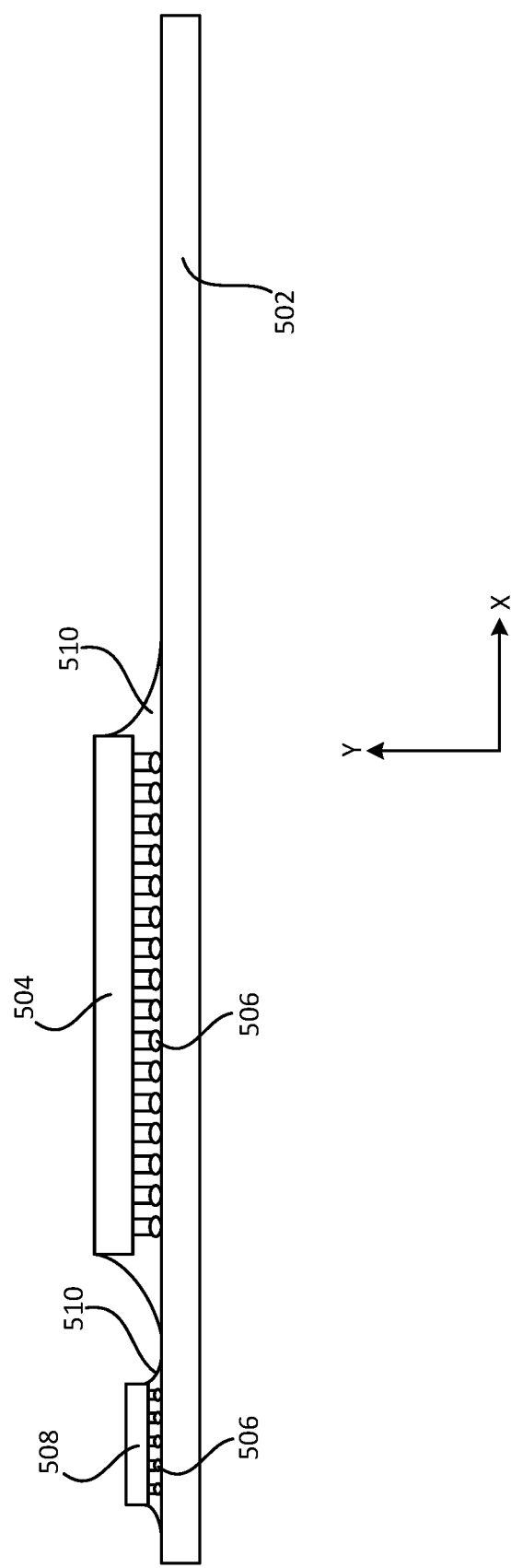
FIG. 10 is a diagram illustrating a first phase of the assembling process of FIG. 9.

The method 600 further includes attaching the flip chip die 504 to the substrate (at block 602) as shown in FIG. 10. In some embodiments, this block 602 may be performed simultaneously or at substantially the same time as block 601. The flip chip die 504 may be attached to the substrate 502 in substantially the same manner as described above with regard to the controller die 508, for instance.

Figure 11:
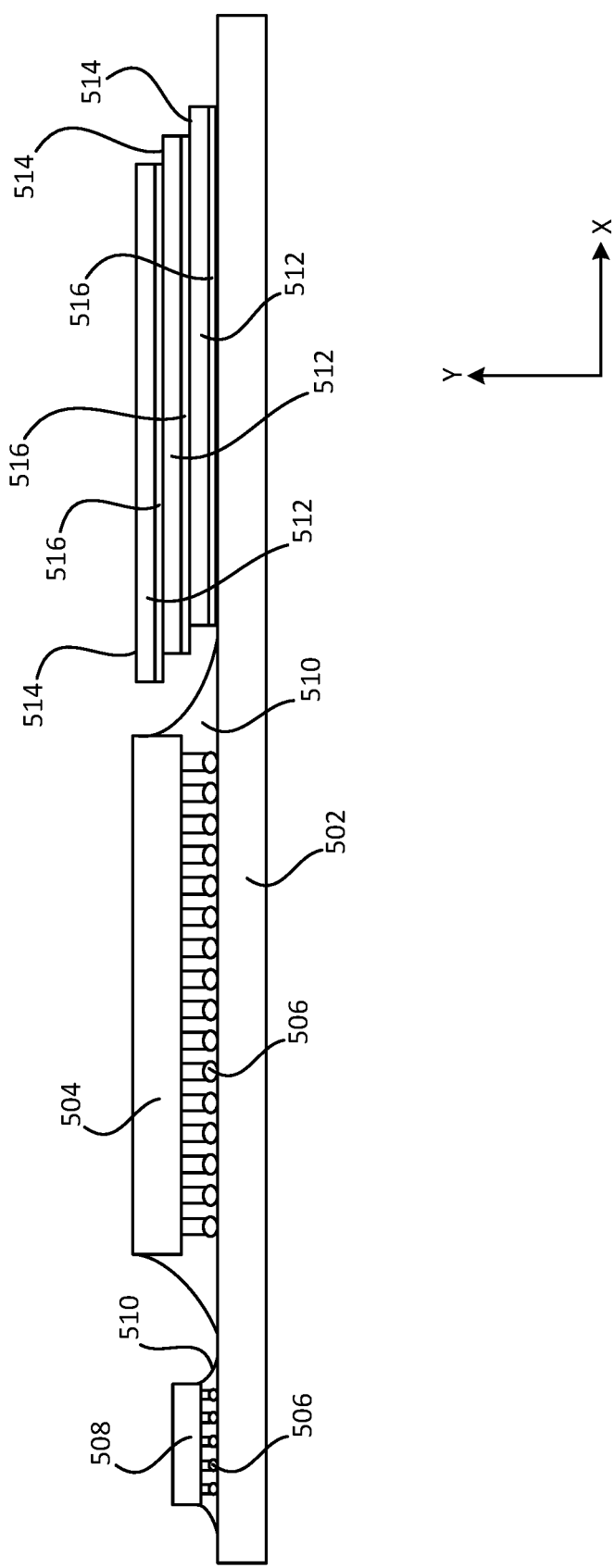
FIG. 11 is a diagram illustrating a second phase of the assembling process of FIG. 9.

The method 600 also includes attaching silicon dies 512 to the substrate 502 (at block 603) as shown in FIG. 11. This block may include, for instance, attaching the silicon dies 512 to each other prior to attaching the stack of silicon dies 512 to the substrate 502. Other embodiments may include attaching one silicon die 512 to the substrate 502, attaching a second silicon die 512 to the top surface of the first silicon die 512, and so forth until all silicon dies 512 are placed. In some embodiments, this block 603 may be performed simultaneously or at substantially the same time as blocks 601 and 602.

Figure 12:
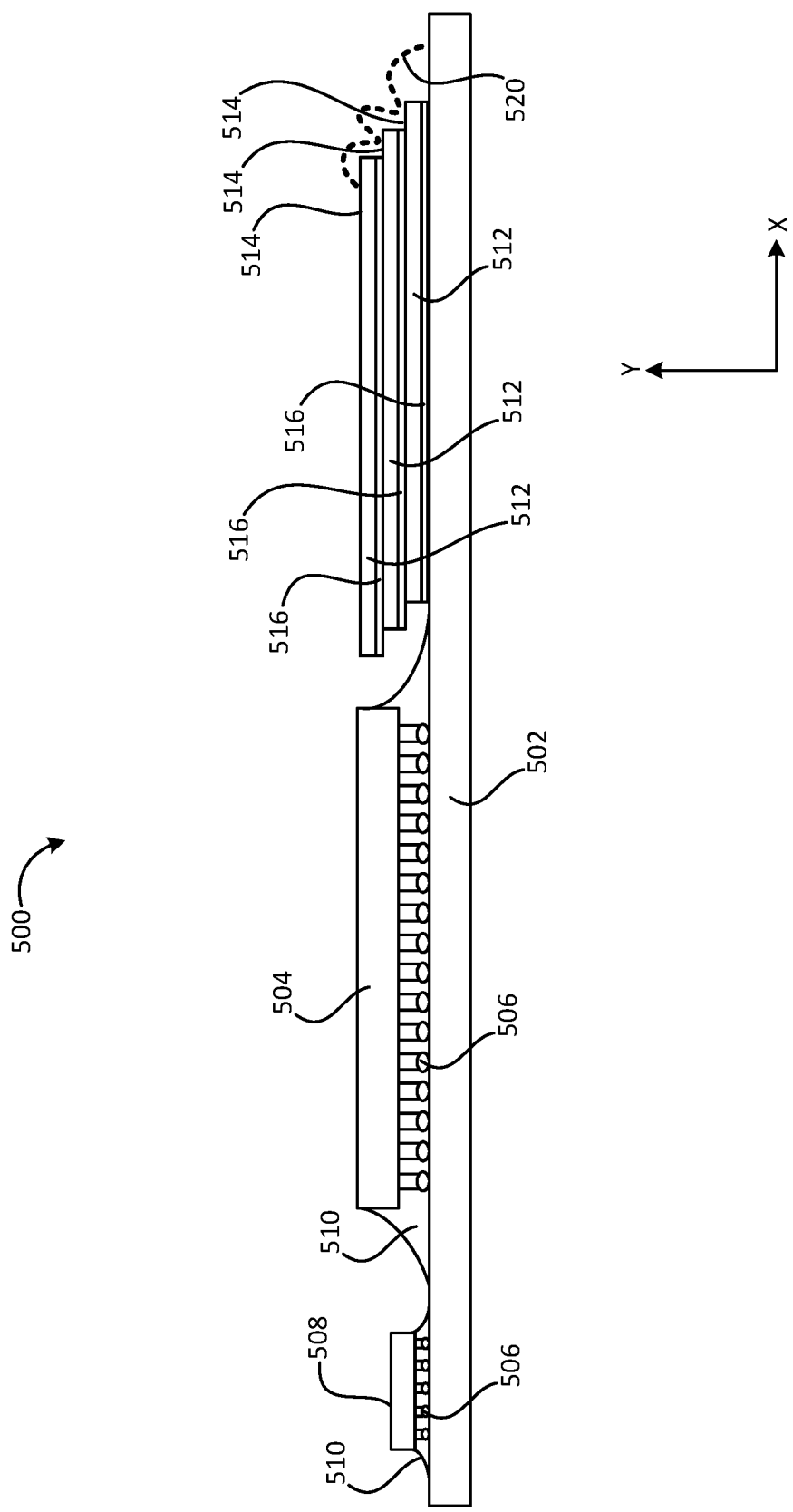
FIG. 12 is a diagram illustrating wiring bonding phase of the assembling process of FIG. 9.

The method 600 further includes electrically connecting the stacked silicon dies 512 to each other and the substrate 502 (e.g., wires or traces on or embedded in the substrate 502) using bond wires, and thereby electrically connecting the silicon dies 512 to other components of the packaged IC 500 such as, for instance, the controller die 508 (at block 604) as shown in FIG. 8. As shown in FIG. 12, the wire(s) 518 of FIG. 8 may be coupled along one or more wire paths 520 with the wire(s) 518 contacting, for instance, the contact pad surface 514 of each of the silicon dies 512.

The methods described above may be implemented, in some embodiments, with no extra assembling steps in the assembling process compared to prior art assembling techniques. Stated another way, the methods described herein can provide for an improved memory device without requiring longer assembling times. One or more of the above described embodiments may allow for improved read/write speeds, improved electrical performance, improved thermal performance, more flexible use of the various dies, and the like.

In particular, the flip chip die may be used by the controller die to store data at a high frequency and/or at demanding high read/write speeds. In addition, the silicon dies may be used by the controller die to store data at lower frequencies relative to the flip chip die and at less demanding lower read/write speeds. The thermal performance may be improved by, for instance, distancing the silicon dies from the substrate with the flip chip die (and, in some embodiments, also with the controller die). This additional distance allows the silicon dies to more efficiently transfer heat to the environment instead of transferring heat into the substrate. Stated another way, the flip chip die may, in some embodiments, improve thermal isolation between the silicon dies and the substrate.

In this regard, a preferred embodiment of the present disclosure is for the flip chip die and the stacked silicon dies all to comprise NAND dies, and further that the flip chip die is configured as SLC memory and the stacked dies are configured as one of MLC memory, TLC memory, or QLC memory. Then, firmware in the controller die is used to read and write "hot" data to the SLC memory (i.e., the flip chip die), and in the background, data can be moved from the SLC memory to the one of the MLC memory, the TLC memory, or the QLC memory. As electrical signals may travel faster between the controller die and the flip chip die, it is advantageous to first store data in the SLC memory of the flip chip die followed by storing the data in the one of the MLC, the TLC, or the QLC memory.

While the foregoing is directed to embodiments of the present disclosure, other and further embodiments of the disclosure may be devised without departing from the basic scope thereof. The scope of the present disclosure should be determined by the following claims.

What is claimed is:

1. A memory device comprising:
   a substrate;
   a controller die attached to the substrate;
   a flip chip die attached to the substrate, adjacent to the controller die, and in electrical communication with the controller die by way of the substrate;
   a first silicon die having a bottom surface attached to one of the substrate or a top surface of the flip chip die, the first silicon die including a first contact pad surface opposite to the bottom surface;
   a second silicon die attached to the first contact pad surface of the first silicon die, the second silicon die including a second contact pad surface;
   one or more bond wires that electrically connect the first and second contact pad surfaces to the substrate, thereby electrically connecting the first and second silicon dies to the controller die by way of the substrate,
   wherein the flip chip die and the first and second silicon dies comprise memory dies,
   wherein the flip chip die is configured as a single-level cell (SLC) memory and the first and second silicon dies are configured as one of a multi-level cell (MLC) memory, a triple-level cell (TLC) memory, and a quad-level cell (QLC) memory,
   wherein the controller die is configured to:
     control the flip chip die to store hot data, and
     control the first and second silicon dies to store cold data,
   wherein the cold data is a portion of the hot data moved from the flip chip die to the first silicon die, the second silicon die, or a combination of the first silicon die and the second silicon die, and
   wherein the controller die is further configured to:
     store only the cold data in the first and second silicon dies, wherein all of the cold data is first written to the flip chip die as the hot data before being moved from the flip chip die to the first silicon die, the second silicon die, or the combination of the first silicon die and the second silicon die.

2. The memory device of claim 1, further comprising:
   a first adhesive layer attaching the bottom surface of the first silicon die to the top surface of the flip chip die, wherein at least a portion of the flip chip die is disposed between the substrate and the first silicon die.

3. The memory device of claim 2, further comprising:
   a second adhesive layer attaching a bottom surface of the second silicon die to the first contact pad surface of the first silicon die.

4. The memory device of claim 2, wherein top surfaces of the controller die and the flip chip die are substantially planar.

5. The memory device of claim 4, wherein one portion of the bottom surface of the first silicon die is attached to the top surface of the flip chip die and another portion of the bottom surface of the first silicon die is attached to the top surface of the controller die such that both the flip chip die and the controller die support the first silicon die.

6. The memory device of claim 1, wherein the bottom surface of the first silicon die is attached to the substrate and adjacent to the flip chip die.

7. The memory device of claim 1, further comprising:
   a third silicon die having a bottom surface attached to the second contact pad surface of the second silicon die, the third silicon die including a third contact pad surface; and
   the one or more bond wires electrically connect the third contact pad surface to the substrate, thereby electrically connecting the third silicon die to the controller die by way of the substrate.

8. The memory device of claim 1, wherein the two or more silicon dies are offset from each other.

9. The memory device of claim 1, further comprising:
   a first plurality of solder bumps that attach the controller die to the substrate;
   a second plurality of solder bumps that attach the flip chip die to the substrate; and
   underfill disposed beneath the controller die and the flip chip die and between the first plurality of solder bumps and the second plurality of solder bumps.

10. The memory device of claim 1, wherein the controller die is further configured to:
    store the hot data at a first frequency or first read/write speeds in the flip chip die,
    store the cold data at a second frequency or second read/write speeds in the first silicon die,
    store the cold data at a third frequency or third read/write speeds in the second silicon die,
    wherein the second frequency and the third frequency are lower than the first frequency, and
    wherein the second read/write speeds and the third read/write speeds are lower than the first read/write speeds.

11. The memory device of claim 1, wherein the controller die is configured to:
    control the flip chip die to store all data as the hot data before moving some or all of the data as the cold data to the first silicon die, the second silicon die, or the combination of the first silicon die and the second silicon die.

12. A memory device, comprising:
    a substrate;
    a controller die attached and electrically connected to the substrate with a plurality of first solder balls;
    a flip chip die attached and electrically connected to the substrate, adjacent to the controller die, with a second plurality of solder balls, such that the flip chip die is in communication with the controller die by way of the substrate; and
    a plurality of silicon dies stacked one atop another in an offset manner, wherein a bottom one of the silicon dies is attached to one of a top surface of the flip chip die and the substrate, and wherein the plurality of silicon dies are electrically connected to the substrate with bond wires such that the plurality of silicon dies are in communication with the controller die by way of the substrate,
    wherein the flip chip die and the plurality of silicon dies comprise NAND dies,
    wherein the flip chip die is configured as a single level cell (SLC) memory and the plurality of silicon dies are configured as one of multi-level cell (MLC), triple-level cell (TLC), and quad-level cell (QLC) memory,
    wherein the controller die is configured to:
      control the flip chip die to store hot data, and control the first and second silicon dies to store cold data, wherein the cold data is a portion of the hot data moved from the flip chip die to the first silicon die, the second silicon die, or a combination of the first silicon die and the second silicon die, and wherein the controller die is further configured to:

store only the cold data in the first and second silicon dies, wherein all of the cold data is first written to the flip chip die as the hot data before being moved from the flip chip die to the first silicon die, the second silicon die, or the combination of the first silicon die and the second silicon die.

13. The memory device of claim 12, wherein the plurality of silicon dies are attached to the top surface of the flip chip die.

14. The memory device of claim 12, wherein the controller die is further configured to:

store the hot data at a first frequency or first read/write speeds in the flip chip die, store the cold data at a second frequency or second read/write speeds in the first silicon die, store the cold data at a third frequency or third read/write speeds in the second silicon die, wherein the second frequency and the third frequency are lower than the first frequency, and wherein the second read/write speeds and the third read/write speeds are lower than the first read/write speeds.

* * * * *